(12) United States Patent
Kon

(10) Patent No.: US 8,940,622 B2
(45) Date of Patent: Jan. 27, 2015

(54) METHOD FOR MANUFACTURING COMPOUND SEMICONDUCTOR DEVICE AND DETERGENT

(75) Inventor: Junichi Kon, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 329 days.

(21) Appl. No.: 13/370,681

(22) Filed: Feb. 10, 2012

(65) Prior Publication Data

US 2012/0214294 A1    Aug. 23, 2012

(30) Foreign Application Priority Data

Feb. 18, 2011    (JP) .................................. 2011-033240

(51) Int. Cl.
| | | |
|---|---|---|
| H01L 21/20 | (2006.01) | |
| C11D 7/60 | (2006.01) | |
| H01L 29/778 | (2006.01) | |
| C11D 7/50 | (2006.01) | |
| C11D 11/00 | (2006.01) | |
| H01L 29/66 | (2006.01) | |
| H01L 29/20 | (2006.01) | |

(52) U.S. Cl.
CPC ........ C11D 11/0047 (2013.01); H01L 29/7787 (2013.01); C11D 7/5013 (2013.01); H01L 29/2003 (2013.01); H01L 29/66462 (2013.01); C11D 7/5022 (2013.01)
USPC ............. 438/478; 438/471; 438/483; 438/22; 438/25; 257/11; 257/12; 257/97; 257/E21.09

(58) Field of Classification Search
CPC ..................... H01L 21/0262; H01L 21/02381; H01L 29/2003; H01L 29/7787; H01L 29/66462; H01L 21/02532; H01L 21/0254; C30B 25/02; C11D 7/5013; C11D 7/5022; C11D 11/0047
USPC .......... 438/478, 471, 483, 22, 25; 257/11, 12, 257/97, E21.09
See application file for complete search history.

(56) References Cited

U.S. PATENT DOCUMENTS

| | | | | |
|---|---|---|---|---|
| 6,232,237 | B1 * | 5/2001 | Tamaoka et al. ............... | 438/725 |
| 2006/0289034 | A1 * | 12/2006 | Small et al. .................... | 134/1.3 |

(Continued)

FOREIGN PATENT DOCUMENTS

| | | |
|---|---|---|
| CN | 101903985 | 12/2010 |
| JP | 11-101970 A | 4/1999 |

(Continued)

OTHER PUBLICATIONS

First Office Action issued Feb. 17, 2014 in counterpart application No. 201210037725.9 from the State Intellectual Property Office of The People's Republic of China with English translation.

(Continued)

*Primary Examiner* — Thinh T Nguyen
(74) *Attorney, Agent, or Firm* — Kratz, Quintos & Hanson, LLP

(57) ABSTRACT

A method for manufacturing a compound semiconductor device, the method includes: forming a compound semiconductor laminated structure; removing a part of the compound semiconductor laminated structure, so as to form a concave portion; and cleaning the inside of the concave portion by using a detergent, wherein the detergent contains a base resin compatible with residues present in the concave portion and a solvent.

8 Claims, 8 Drawing Sheets

(56) References Cited

U.S. PATENT DOCUMENTS

| | | |
|---|---|---|
| 2009/0151752 A1 | 6/2009 | Mui et al. |
| 2010/0013053 A1 | 1/2010 | Nakayama et al. |
| 2010/0044752 A1 | 2/2010 | Marui |
| 2010/0167972 A1 | 7/2010 | Kawase et al. |
| 2010/0242998 A1 | 9/2010 | Quillen et al. |
| 2010/0294306 A1 | 11/2010 | Mochizuki et al. |
| 2011/0049529 A1 | 3/2011 | Sato et al. |

FOREIGN PATENT DOCUMENTS

| | | |
|---|---|---|
| JP | 2003-167360 A1 | 6/2003 |
| JP | 2003-313594 A | 11/2003 |
| JP | 2006-201332 A | 8/2006 |
| JP | 2007-128038 A1 | 5/2007 |
| JP | 2010-050347 A | 3/2010 |
| JP | 2010-272728 | 12/2010 |
| TW | 200903605 | 1/2009 |
| TW | 200933728 | 8/2009 |
| TW | 201005816 | 2/2010 |

OTHER PUBLICATIONS

Examination Report from the Intellectual Property Office of Taiwan dated Mar. 10, 2014 issued in counterpart application No. 101105212 with English translation.

Office Action dated Sep. 30, 2014 corresponding to Japan Patent Application No. 2011-033240 with English translation.

* cited by examiner

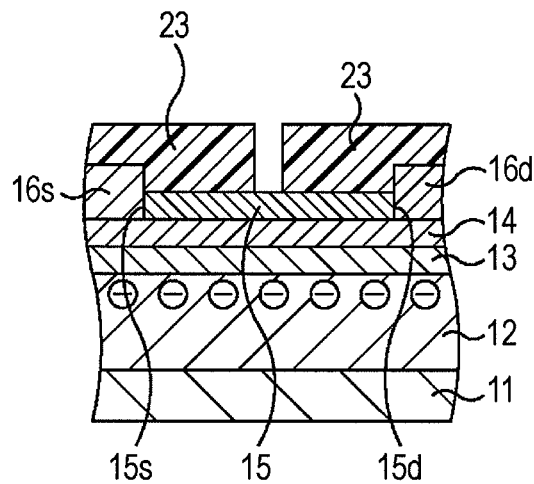
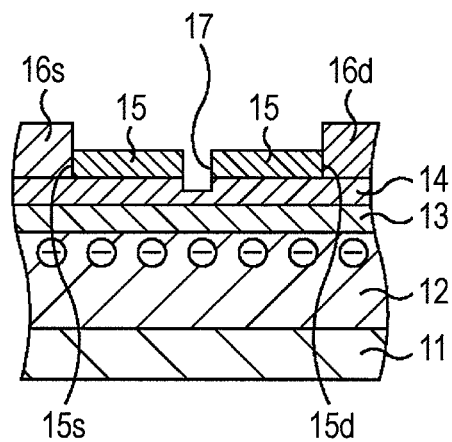
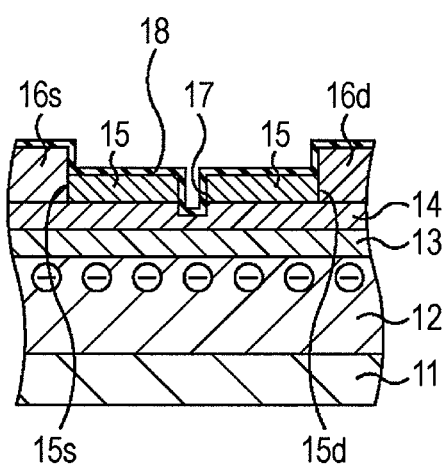
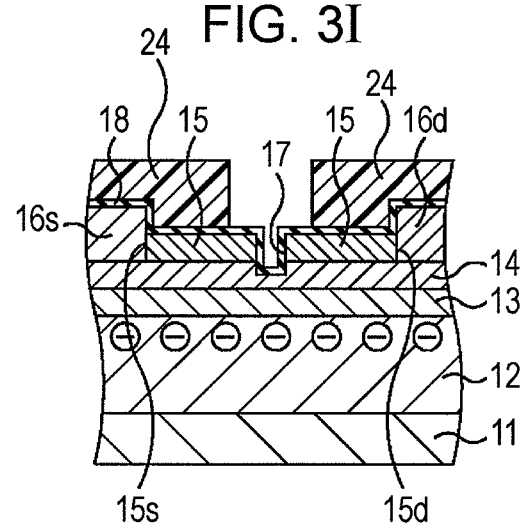
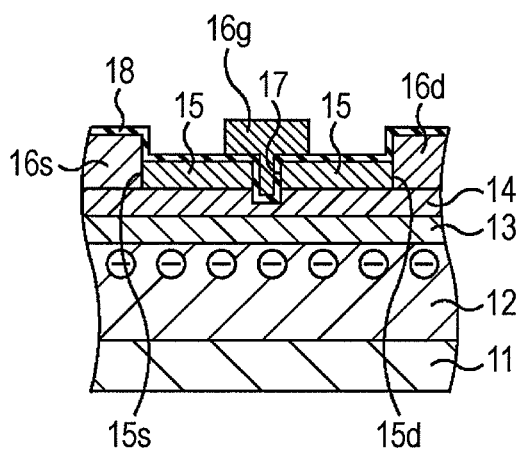

FIG. 7

| DETERGENT No. | BASE RESIN | | SOLVENT | | REDUCING AGENT | | CROSS-LINKING AGENT | | SURFACTANT | |
|---|---|---|---|---|---|---|---|---|---|---|
| | TYPE | CONTENT (PERCENT BY MASS) | TYPE | CONTENT (PERCENT BY MASS) | TYPE | CONTENT (PERCENT BY MASS) | TYPE | CONTENT (PERCENT BY MASS) | TYPE | CONTENT (PERCENT BY MASS) |
| 1 | PVA/30% ACETALIZATION | 10 | WATER | 90 | NONE | | NONE | | NONE | |
| 2 | PVA/31% ACETALIZATION | 10 | WATER | 85 | OXALIC ACID | 5 | NONE | | NONE | |
| 3 | PVA/32% ACETALIZATION | 10 | WATER | 85 | FORMIC ACID | 5 | NONE | | NONE | |
| 4 | PVA/32% ACETALIZATION | 0.5 | WATER | 94.5 | OXALIC ACID | 5 | NONE | | NONE | |
| 5 | PVA/32% ACETALIZATION | 50 | WATER | 45 | OXALIC ACID | 5 | NONE | | NONE | |
| 6 | PVA/32% ACETALIZATION | 10 | WATER | 89.5 | OXALIC ACID | 0.5 | NONE | | NONE | |
| 7 | PVA/32% ACETALIZATION | 10 | WATER | 40 | OXALIC ACID | 50 | NONE | | NONE | |
| 8 | PVA/32% ACETALIZATION | 10 | WATER | 84 | OXALIC ACID | 5 | UREA | 1.0 | NONE | |
| 9 | PVA/32% ACETALIZATION | 10 | WATER | 84 | OXALIC ACID | 5 | MELAMINE | 1.0 | NONE | |
| 10 | PVA/32% ACETALIZATION | 10 | WATER | 84 | OXALIC ACID | 5 | URIL | 1.0 | NONE | |
| 11 | PVA/32% ACETALIZATION | 10 | WATER | 84.95 | OXALIC ACID | 5 | NONE | | TN-80 | 0.05 |
| 12 | PVA/32% ACETALIZATION | 10 | WATER | 84.95 | OXALIC ACID | 5 | NONE | | PC-8 | 0.05 |
| 13 | PVA | 10 | WATER | 85 | OXALIC ACID | 5 | NONE | | NONE | |
| 14 | PVP | 10 | WATER | 85 | OXALIC ACID | 5 | NONE | | NONE | |
| 15 | PHS | 10 | EL / IPA | 55 / 30 | OXALIC ACID | 5 | NONE | | NONE | |

FIG. 8

| EXAMPLE No. | DETERGENT No. | HEATING TEMPERATURE (°C) | NUMBER OF PARTICLES (PARTICLES/cm²) | OXYGEN CONCENTRATION RATIO (%) |
|---|---|---|---|---|
| 1 | 1 | 150 | 3.1 | 33 |
| 2 | 2 | 150 | 2.9 | 19 |
| 3 | 3 | 150 | 3.8 | 24 |
| 4 | 4 | 150 | 21 | 29 |
| 5 | 5 | 150 | 18 | 23 |
| 6 | 6 | 150 | 4.3 | 30 |
| 7 | 7 | 150 | 16 | 17 |
| 8 | 8 | 150 | 1.2 | 20 |
| 9 | 9 | 150 | 0.74 | 20 |
| 10 | 10 | 150 | 0.95 | 21 |
| 11 | 11 | 150 | 1.5 | 19 |
| 12 | 12 | 150 | 1.3 | 20 |
| 13 | 13 | 150 | 3.9 | 21 |
| 14 | 14 | 150 | 4.2 | 20 |
| 15 | 15 | 150 | 11 | 22 |
| COMPARATIVE EXAMPLE | NONE | | 26 | 32 |

METHOD FOR MANUFACTURING COMPOUND SEMICONDUCTOR DEVICE AND DETERGENT

CROSS-REFERENCE TO RELATED APPLICATION

This application is based upon and claims the benefit of priority from the prior Japanese Patent Application No. 2011-33240 filed on Feb. 18, 2011, the entire contents of which are incorporated herein by reference.

FIELD

The embodiments discussed herein are related to a method for manufacturing a compound semiconductor device and a detergent.

BACKGROUND

In recent years, an electronic device (compound semiconductor device), in which a GaN layer and an AlGaN layer are disposed sequentially above a substrate and the GaN layer is used as an electron transit layer, has been developed actively. As for an example of such compound semiconductor devices, a GaN based high electron mobility transistor (HEMT) is mentioned. In the GaN based HEMT, a high-concentration two-dimensional electron gas (2DEG) generated at a heterojunction interface between AlGaN and GaN is utilized.

The band gap of GaN is 3.4 eV and is larger than the band gap of Si (1.1 eV) and the band gap of GaAs (1.4 eV). That is, GaN has a high breakdown field strength. Furthermore, GaN has also a large saturation electron velocity. Therefore, GaN is a very promising material for a compound semiconductor device capable of high-voltage operation and production of high output, for example, a material for a semiconductor device for a power supply. Consequently, the compound semiconductor device by using the GaN based compound semiconductor device is expected as a high-breakdown voltage power device for a high-efficiency switching element, an electric car, and the like.

Regarding the GaN based HEMT, the material for a gate electrode is different from the material for the source electrode and the drain electrode. Therefore, the gate electrode is formed by a process different from that of the source electrode and the drain electrode. The gate electrode, the source electrode, and the drain electrode are formed by, for example, a lift-off method. That is, in formation of the electrode, formation of a resist pattern, formation of an electrode material, and removal of the resist pattern are performed. Meanwhile, in production of a GaN based HEMT, recesses or opening portions may be formed in regions to be provided with the gate electrode, the source electrode, and the drain electrode of the compound semiconductor layer. In this case, a compound semiconductor layer is etched by using a resist pattern, so as to form a recess or an opening portion, and thereafter, the resist is removed. Furthermore, after the source electrode and the drain electrode are formed, the source electrode and the drain electrode may be covered with a passivation film, and before formation of the gate electrode, the passivation film may be dry-etched by using a resist pattern. In this case, the resist is removed after the dry etching.

In these methods, although the resist is removed, residues of the resist may remain. Moreover, after the dry etching of the passivation film, etching residues may remain. In this regard, these residues may not be removed sufficiently even by cleaning with an organic material. This is because of effects of alteration and the like during post baking after development performed in formation of the resist pattern and dry etching.

Meanwhile, when the residues are removed by an acid treatment through the use of, for example, a mixture of sulfuric acid and aqueous hydrogen peroxide, an electrode exposed at that time is damaged. For example, in the case where a recess for the gate electrode is formed after the source electrode and the drain electrode are formed, the source electrode and the drain electrode are exposed during formation of the recess. Therefore, if the above-described mixture is used, the source electrode and the drain electrode are damaged. Alternatively, even when the electrodes are not damaged, the exposed surface of the compound semiconductor layer may undergo oxidation, surface roughening, and the like, so that the characteristics may be changed.

Then, in the case where the above-described residues are present, an increase in leakage current, fluctuations in threshold voltage due to trap of charge, and the like occur, so that the yield is reduced significantly.

The followings are reference documents:
[Document 1] Japanese Laid-open Patent publication No. 2003-167360 and
[Document 2] Japanese Laid-open Patent publication No. 2007-128038.

SUMMARY

According to an aspect of the embodiment, a method for manufacturing a compound semiconductor device includes forming a compound semiconductor laminated structure, removing a part of the above-described compound semiconductor laminated structure, so as to form a concave portion, and cleaning the inside of the above-described concave portion by using a detergent, wherein the above-described detergent contains a base resin compatible with residues present in the above-described concave portion and a solvent.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A to 3J are sectional views illustrating a method for manufacturing a GaN based HEMT according to a second embodiment in the order of steps;

FIG. 7 illustrates various detergents for experiments.

FIG. 8 illustrates a number of particles and the oxygen concentration ratio of the surface of n-AlGaN electron supply layer.

DESCRIPTION OF EMBODIMENTS

The embodiments will be concretely described below with reference to attached drawings.

First Embodiment

Figure 1A:
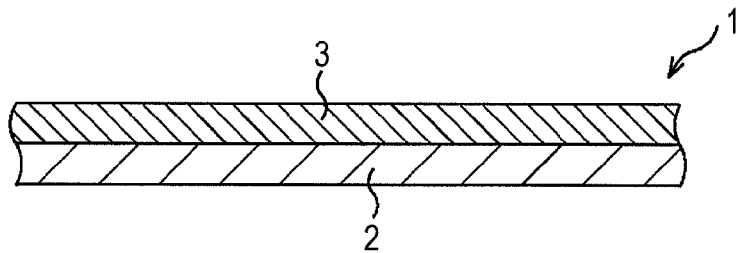
FIGS. 1A to 1C are sectional views illustrating a method for manufacturing a compound semiconductor device according to a first embodiment in the order of steps.
Figure 1B:
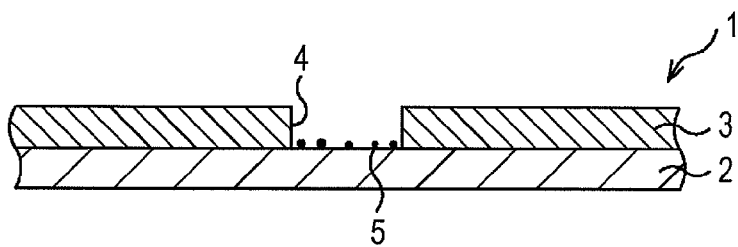
Figure 1C:
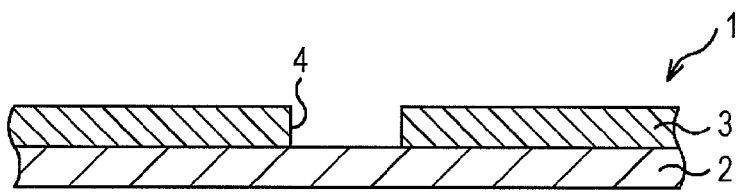

A first embodiment will be described. FIGS. 1A to 1C are sectional views illustrating a method for manufacturing a compound semiconductor device according to the first embodiment in the order of steps.

In the first embodiment, as illustrated in FIG. 1A, a laminate 1 including a compound semiconductor layer 2 and a compound semiconductor layer 3 thereon is formed. The laminate 1 is an example of a compound semiconductor laminated structure. The compound semiconductor layers 2 and 3 are nitride semiconductor layers, e.g., a GaN layer, an AlGaN layer, and an AlN layer.

Subsequently, as illustrated in FIG. 1B, a recess 4 is formed by removing a part of the laminate 1. The recess 4 is an example of concave portions. The method for forming the recess 4 is not specifically limited, and examples thereof include dry etching by using a resist pattern as an etching mask. After the recess 4 is formed, residues 5 may be present in the recess 4. The residues 5 are, for example, residues of the resist pattern and residues of the compound semiconductor layer 3. In this regard, in FIG. 1B, the recess 4 reaches the surface of the compound semiconductor layer 2. However, the recess 4 may make inroads into the inside of the compound semiconductor layer 2, or the recess 4 may not reach the surface of the compound semiconductor layer 2. That is, the depth of the recess 4 may be larger than or smaller than the thickness of the compound semiconductor layer 3.

Thereafter, as illustrated in FIG. 1C, the inside of the recess 4 is cleaned by using a detergent. The detergent used in the present embodiment contains a base resin compatible with the residues 5 and a solvent. Consequently, the residues 5 are removed.

As for the base resin, for example, polyvinyl alcohols, polyvinyl acetals, polyvinyl acetates, polyvinyl pyrrolidones, polyacrylic acids, polyethylene oxides, phenolic hydroxyl group-containing resins, carboxylic group-containing resins, and epoxy resins may be used. Copolymers or mixtures thereof may also be used.

The content of the base resin in the detergent is not specifically limited and is preferably 0.1 percent by mass to 50 percent by mass. If the content of the base resin is less than 0.1 percent by mass, components compatible with the residues 5 become insufficient, and the residues 5 may not be removed sufficiently. On the other hand, if the content of the base material is larger than 50 percent by mass, the viscosity of the detergent becomes too high and, thereby, the detergent does not wet and spread on the surface of the laminate 1 easily. Therefore, the content of the base resin is preferably 0.1 percent by mass to 50 percent by mass.

As for the solvent, it is preferable to use water. However, organic solvents, e.g., alcohol based organic solvents, chain ester based organic solvents, cyclic ester based organic solvents, ketone based organic solvents, chain ether based organic solvents, cyclic ether based organic solvents, and amine based organic solvents, may be used. Examples of alcohol based organic solvents include isopropyl alcohol. Examples of chain ester based organic solvents include ethyl acetate, butyl acetate, ethyl lactate, propylene glycol methyl ether (PGME), and propylene glycol methyl ether acetate (PGMEA). Preferable examples of cyclic ester based organic solvents include lactone based organic solvents, and in particular, γ-butyrolactone is preferable. Examples of ketone based organic solvents include acetone, cyclohexanone, and heptanone. Examples of chain ether based organic solvents include ethylene glycol dimethyl ether. As for the cyclic ether based organic solvents, tetrahydrofuran and dioxane are mentioned. As for the amine based organic solvents, N-methyl-2-pyrrolidone (NMP), dimethylformamide (DMF), N,N-dimethylacetoamide (DMAC), and amino alcohol are mentioned.

According to the first embodiment, the residues 5 may be removed sufficiently without performing an acid treatment. Therefore, a compound semiconductor device having desired characteristics may be produced at a high yield.

Figure 2:
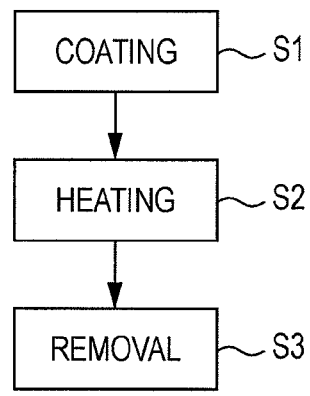
FIG. 2 is a flow chart illustrating an example of a cleaning method.

Here, an example of methods for cleaning the inside of the recess 4 by using the detergent will be described, although the cleaning method is not limited to this example. FIG. 2 is a flow chart illustrating an example of the cleaning method.

Initially, the detergent is applied to the surface of the laminate 1 provided with the recess 4 (step S1). Subsequently, the detergent is heated, so as to dissolve the base resin and the residues 5 with each other and, in addition, vaporize the solvent in the detergent (step S2). As a result, a surface-treated film is formed. Thereafter, the surface-treated film is dissolved and removed by using a predetermined liquid (step S3).

Examples of treatments to apply the detergent include a dipping treatment, a spinning treatment, and a spraying treatment. The heating temperature is not specifically limited but is preferably specified to be 50° C. to 250° C. If this temperature is lower than 50° C., it may become difficult to dissolve the base resin and the residues 5 with each other sufficiently. On the other hand, if this temperature is higher than 250° C., the components of the detergent may be decomposed. Therefore, it is preferable that the heating temperature is specified to be 50° C. to 250° C. In this regard, examples of liquids to remove the surface-treated film include the same solvents as that contained in the detergent.

Meanwhile, it is preferable that a reducing agent, besides the base resin and the solvent, is contained in the detergent. This is because the surface of the laminate 1 may be oxidized before being cleaned and the surface of the laminate 1 may be oxidized during cleaning.

As for the reducing agent, for example, organic acids, e.g., carboxylic acids, and aldehyde may be used. Examples of carboxylic acids include oxalic acid and formic acid. The content of the reducing agent in the detergent is not specifically limited, but is preferably specified to be 0.1 percent by mass to 40 percent by mass. If the content of the reducing agent is less than 0.1 percent by mass, a sufficient reducing effect may not be obtained. On the other hand, if the content of the reducing agent is larger than 40 percent by mass, dissolution into the solvent may become difficult. Therefore, it is preferable that the content of the reducing agent is specified to be 0.1 percent by mass to 40 percent by mass.

A cross-linking agent, besides the base resin and the solvent, may be contained in the detergent. A cross-linking reaction occurs between the residues 5 and the base resin by the action of the cross-linking agent, and the residues 5 are removed more easily.

Examples of cross-linking agents include melamine and derivatives thereof, urea and derivatives thereof, and uril and derivatives thereof. Examples of melamine include alkoxymethyl melamine. Examples of urea include urea, alkoxy methylene urea, N-alkoxy methylene urea, ethylene urea, and ethylene urea carboxylic acid. Examples of uril include benzoguanamine and glycoluril. The content of the cross-linking agent in the detergent is not specifically limited and is determined appropriately in accordance with the type, the content, and the like of the base resin.

A surfactant, besides the base resin and the solvent, may be contained in the detergent. For example, the compatibility between the base resin and the residues 5 is improved by virtue of the surfactant.

As for the surfactant, for example, nonionic surfactants, cationic surfactants, anionic surfactants, and ampholytic surfactants may be used. One type of them may be contained in the detergent or at least two types may be contained. Among them, the nonionic surfactants are preferable because no metal ion is contained.

Examples of nonionic surfactants include alcohol based surfactants, e.g., alkoxylate based surfactants, fatty acid ester based surfactants, amide based surfactants, and natural alcohol based surfactants, ethylenediamine based surfactants, and secondary alcohol ethoxylate based surfactants. Concrete examples thereof include polyoxyethylene-polyoxypropylene condensate based surfactants, polyoxyalkylene alkyl ether based surfactants, polyoxyethylene alkyl ether based surfactants, polyoxyethylene derivative based surfactants, sorbitan fatty acid ester based surfactants, glycerin fatty acid ester based surfactants, primary alcohol ethoxylate based surfactants, phenol ethoxylate based surfactants, and acetylenediol based surfactants. In addition, nonylphenol ethoxylate based surfactants, octylphenol ethoxylate based surfactants, lauryl alcohol ethoxylate based surfactants, and oleyl alcohol ethoxylate based surfactants are mentioned.

Examples of cationic surfactants include alkyl cationic surfactants, amide type quaternary cationic surfactants, and ester type quaternary cationic surfactants.

Examples of ampholytic surfactants include amine oxide based surfactants and betaine based surfactants.

The content of the surfactant in the detergent is not specifically limited, but is preferably specified to be 50 ppm or less. If the content of the surfactant is larger than 50 ppm, the base resin and the cross-linking agent may penetrate the interface, and the base resin and the cross-linking agent may remain in the semiconductor device. Then, if the base resin and the cross-linking agent remain, short circuit, leakage, and the like may occur and the characteristics may be degraded. Therefore, it is preferable that the content of the surfactant is 50 ppm or less.

In this regard, the removal performance of the residue 5 and the degree of reduction of the treated surface may be controlled optionally by adjusting the types and the proportions of the base resin, the solvent, the reducing agent, and the surfactant.

Second Embodiment

Next, a second embodiment will be described. FIGS. 3A to 3J are sectional views illustrating a method for manufacturing a GaN based HEMT (compound semiconductor device) according to the second embodiment in the order of steps.

Figure 3A:
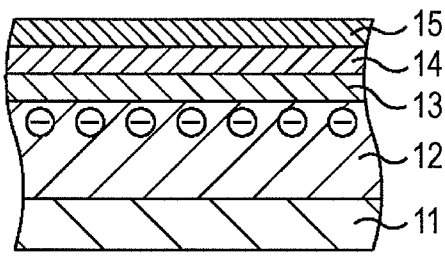

In the second embodiment, as illustrated in FIG. 3A, a non-doped i-GaN layer 12, a non-doped i-AlGaN layer 13, an n-type n-AlGaN layer 14, and an n-type n-GaN layer 15 are formed on a substrate 11. Formation of the i-GaN layer 12, i-AlGaN layer 13, the n-AlGaN layer 14, and the n-GaN layer 15 is performed by a crystal growth method, e.g., a metal organic vapor phase epitaxy (MOVPE) method. In this case, these layers may be formed continuously by selecting raw material gases. As for the raw material for aluminum (Al) and gallium (Ga), for example, trimethyl aluminum (TMA) and trimethyl gallium (TMG), respectively, may be used. As for the material for nitrogen (N), for example, ammonia ($NH_3$)

may be used. As for the raw material for silicon (Si) serving as an impurity contained in the n-AlGaN layer 14 and the n-GaN layer 15, for example, silane ($SiH_4$) may be used.

The thickness of the i-GaN layer 12 is, for example, about 3 μm, and the i-GaN layer 12 functions as an electron transit layer. The thickness of the i-AlGaN layer 13 is, for example, about 5 nm, and the i-AlGaN layer 13 functions as a spacer layer. The thickness of the n-AlGaN layer 14 is, for example, about 30 nm, and the n-AlGaN layer 14 functions as an electron supply layer. The thickness of the n-GaN layer 15 is, for example, about 10 nm, and the n-GaN layer 15 functions as a cap layer. The Al composition of the i-AlGaN layer 13 and the n-AlGaN layer 14 are, for example, about 0.2. The n-AlGaN layer 14 and the n-GaN layer 15 are doped with, for example, about $5 \times 10^{18}$ $cm^{-3}$ of Si serving as an n-type impurity.

Figure 3B:
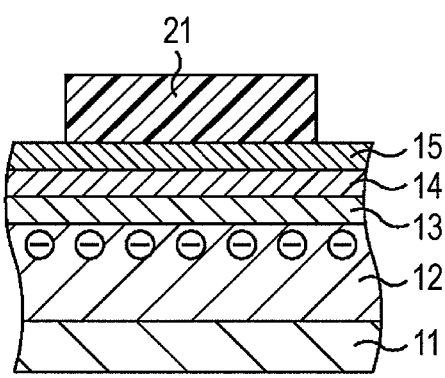

As illustrated in FIG. 3B, a resist pattern 21 having an opening portion exposing a region to be provided with a source electrode and an opening portion exposing a portion to be provided with a drain electrode is formed on the n-GaN layer 15.

Figure 3C:
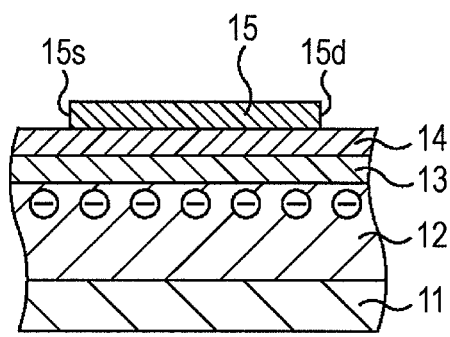

As illustrated in FIG. 3C, the n-GaN layer 15 is dry-etched by using the resist pattern 21 as an etching mask, so as to form an opening portion 15s for the source electrode and the opening portion 15d for the drain electrode. The opening portions 15s and 15d are examples of concave portions. In this dry etching, for example, a chlorine based gas is used as the etching gas. Likewise, as illustrated in FIG. 3C, the resist pattern 21 is removed through ashing or the like.

Regarding the depths of the opening portions 15s and 15d, a part of the n-GaN layer 15 may be left, or a part of the n-AlGaN layer 14 may be removed. That is, the depths of the opening portions 15s and 15d do not necessarily agree with the thickness of the n-GaN layer 15.

The insides of the opening portions 15s and 15d are cleaned by using the same detergent as that in the first embodiment. Consequently, the insides of the opening portions 15s and 15d are cleaned sufficiently.

Figure 3D:
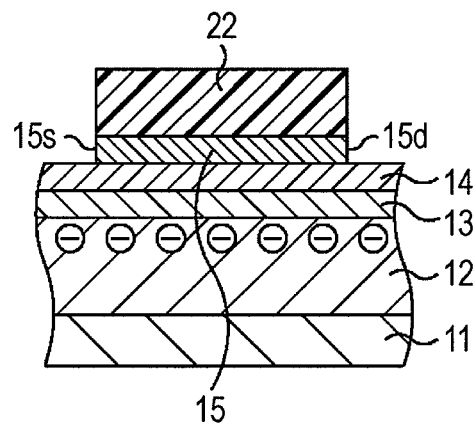

As illustrated in FIG. 3D, a resist pattern 22 having an opening portion exposing a region to be provided with a source electrode and an opening portion exposing a portion to be provided with a drain electrode is formed on the n-GaN layer 15.

Figure 3E:
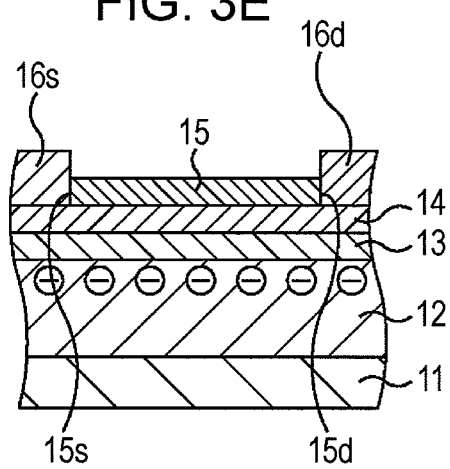

An electrically conductive film is formed by using the resist pattern 22 as a film formation mask, and the electrically conductive film adhering on the resist pattern 22 is removed together with the resist pattern 22. Consequently, as illustrated in FIG. 3E, the source electrode 16s and the drain electrode 16d are formed. As described above, in the present embodiment, the source electrode 16s and the drain electrode 16d are formed by a lift-off method. Regarding formation of the electrically conductive film, for example, a Ta film having a thickness of about 20 nm is formed, and an Al film having a thickness of about 200 nm is formed thereon. The Ta film and the Al films may be formed by, for example, an evaporation method. Then, a heat treatment is performed in a nitrogen atmosphere at 400° C. to 1,000° C. (for example, 550° C.), so as to establish ohmic contact.

The surface of the n-GaN layer 15 is cleaned by using the same detergent as that in the first embodiment. Consequently, the surface of the n-GaN layer 15 is cleaned sufficiently. In this regard, this treatment may be omitted.

As illustrated in FIG. 3F, a resist pattern 23 having an opening portion exposing a region to be provided with a gate electrode is formed on the n-GaN layer 15, the source electrode 16s, and the drain electrode 16d.

As illustrated in FIG. 3G, the n-GaN layer 15 and the n-AlGaN layer 14 are dry-etched by using the resist pattern 23 as an etching mask, so as to form a recess 17 for the gate electrode. The recess 17 is an example of concave portions. In this dry etching, for example, a chlorine based gas is used as the etching gas. Likewise, as illustrated in FIG. 3G, the resist pattern 23 is removed through ashing or the like.

Regarding the depth of the recess 17, a part of the n-GaN layer 15 may be left, or the bottom of the recess 17 may agree with the surface of the n-AlGaN layer 14. That is, the depth of the recess 17 is not necessarily made larger than the thickness of the n-GaN layer 15.

The inside of the recess 17 is cleaned by using the same detergent as that in the first embodiment. Consequently, the inside of the recess 17 is cleaned sufficiently.

As illustrated in FIG. 3H, an insulating film 18 is formed all over the surface. As for the material for the insulating film 18, oxides, nitrides, or oxynitrides of Si, Al, Hf, Zr, Ti, Ta, or W are preferable. For example, the insulating film 18 is an alumina film. The thickness of the insulating film 18 is not specifically limited, but is specified to be 2 nm to 200 nm (for example, 10 nm). Furthermore, the method for forming the insulating film 18 is not specifically limited, but an atomic layer deposition (ALD) method, a chemical vapor deposition (CVD) method, or a sputtering method is preferable.

The surface of the insulating film 18 is cleaned by using the same detergent as that in the first embodiment. Consequently, the surface of the insulating film 18 is cleaned sufficiently.

As illustrated in FIG. 3I, a resist pattern 24 having an opening portion exposing a region to be provided with a gate electrode is formed on the insulating film 18.

An electrically conductive film is formed by using the resist pattern 24 as a film formation mask, and the electrically conductive film adhering on the resist pattern 24 is removed together with the resist pattern 24. Consequently, as illustrated in FIG. 3J, the gate electrode 16g is formed. As described above, in the present embodiment, the gate electrode 16g is formed by a lift-off method. Regarding formation of the electrically conductive film, for example, a Ni film having a thickness of about 30 nm is formed, and an Au film having a thickness of about 400 nm is formed thereon. The Ni film and the Au film may be formed by, for example, the evaporation method. As described above, the GaN based HEMT may be produced.

When the present inventors produced the GaN based HEMT by the method according to the second embodiment actually, the yield of 96% was obtained. On the other hand, in the case where the GaN based HEMT was produced while each of the cleaning by using the above-described detergent was omitted, the yield was only 72%.

Third Embodiment

Next, a third embodiment will be described. FIGS. 4A to 4F are sectional views illustrating a method for manufacturing a GaN based HEMT (compound semiconductor device) according to the third embodiment in the order of steps.

Figure 4A:
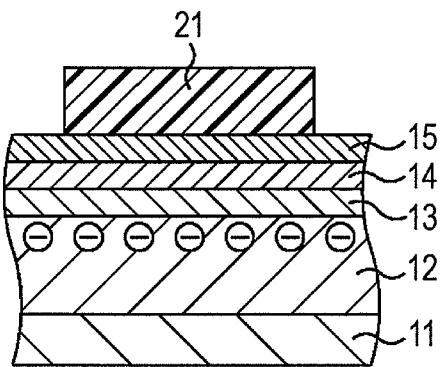
FIGS. 4A to 4F are sectional views illustrating a method for manufacturing a GaN based HEMT according to a third embodiment in the order of steps.
Figure 4B:
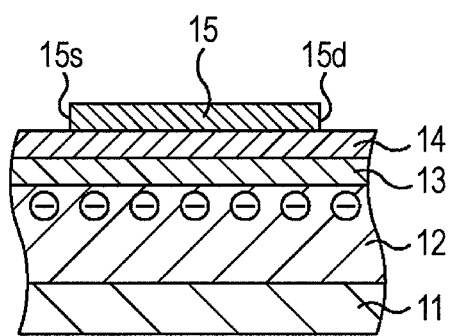

In the third embodiment, as illustrated in FIG. 4A, the treatments up to formation of the resist pattern 21 are performed in the same manner as in the second embodiment. Subsequently, as illustrated in FIG. 4B, the opening portion 15s for a source electrode and the opening portion 15d for a drain electrode are formed and the resist pattern 21 is removed through ashing or the like in the same manner as in the second embodiment.

The insides of the opening portion 15s and the opening portion 15d are cleaned by using the same detergent as that in the first embodiment. Consequently, the insides of the opening portion 15s and the opening portion 15d are cleaned sufficiently.

Figure 4C:
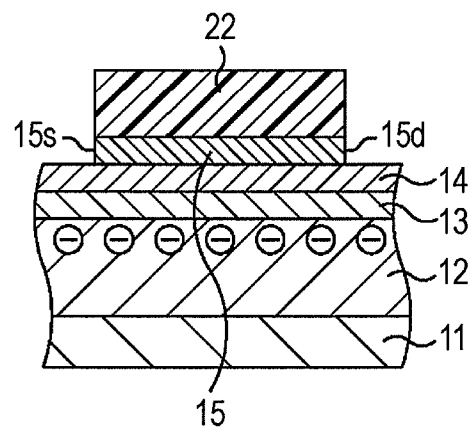
Figure 4D:
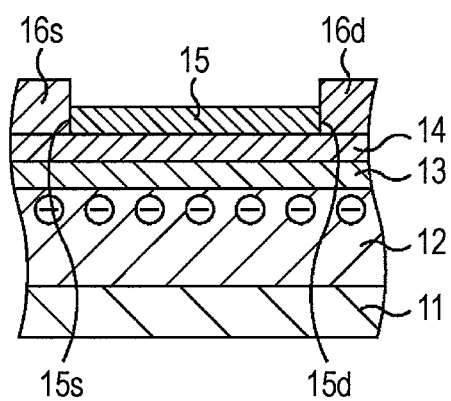

As illustrated in FIG. 4C, the resist pattern 22 is formed on the n-GaN layer 15 in the same manner as in the second embodiment. Then, as illustrated in FIG. 4D, the source electrode 16s and the drain electrode 16d are formed, and a heat treatment is performed, so as to establish ohmic contact in the same manner as in the second embodiment.

The surface of the n-GaN layer 15 is cleaned by using the same detergent as that in the first embodiment. Consequently, the surface of the n-GaN layer 15 is cleaned sufficiently.

Figure 4E:
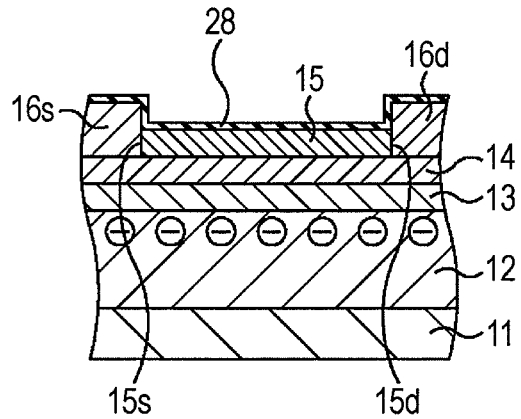

As illustrated in FIG. 4E, an insulating film 28 is formed all over the surface. As for the film 28, the same insulating film as the insulating film 18 in the second embodiment is formed.

The surface of the insulating film 28 is cleaned by using the same detergent as that in the first embodiment. Consequently, the surface of the insulating film 28 is cleaned sufficiently.

Figure 4F:
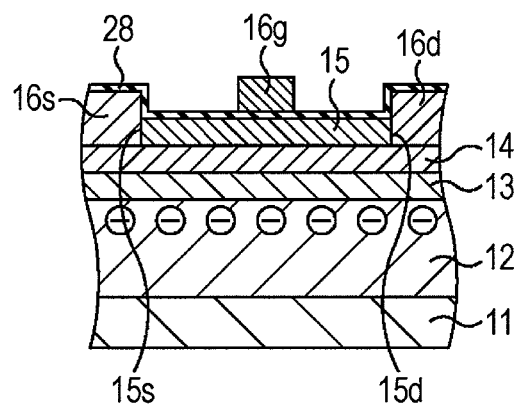

As illustrated in FIG. 4F, the gate electrode 16g is formed on the insulating film 28 by the lift-off method in the same manner as in the second embodiment. As described above, the GaN based HEMT may be produced.

When the present inventors produced the GaN based HEMT by the method according to the third embodiment actually, the yield of 97% was obtained. On the other hand, in the case where the GaN based HEMT was produced while each of the cleaning by using the above-described detergent was omitted, the yield was only 75%.

Meanwhile, in the second embodiment and the third embodiment, an element isolation region may be formed before formation of the resist pattern 21. For example, the element isolation region may be formed through dry etching by using a resist pattern having an opening portion in a region to be provided with the element isolation region. In this case, as for the etching gas, for example, a chlorine based gas may be used. Then, after the resist pattern is removed, it is preferable that cleaning by using the above-described detergent is performed. Alternatively, the element isolation region may also be formed through ion implantation of Ar ion or the like instead of dry etching.

Furthermore, a resistor, a capacitor, and the like may be mounted on the substrate 11, so as to produce a monolithic microwave integrated circuit (MMIC).

Figure 5:
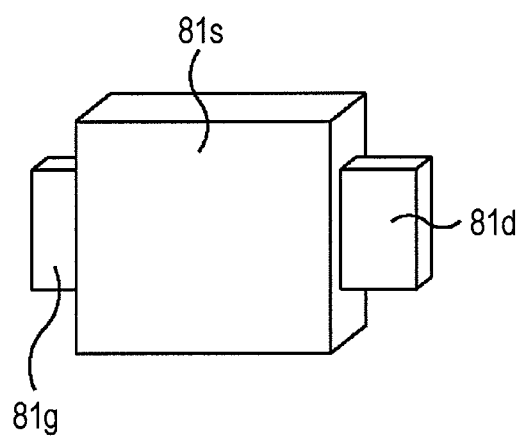
FIG. 5 is a diagram illustrating an example of an outward appearance of a high-output amplifier.

These GaN based HEMT may be used as, for example, a high-output amplifier. FIG. 5 is a diagram illustrating an example of an outward appearance of the high-output amplifier. In this example, a source terminal 81s connected to a source electrode is disposed on the surface of a package. Meanwhile, a gate terminal 81g connected to a gate electrode and a drain terminal 81d connected to a drain electrode are extended from the side surfaces of the package.

Figure 6A:
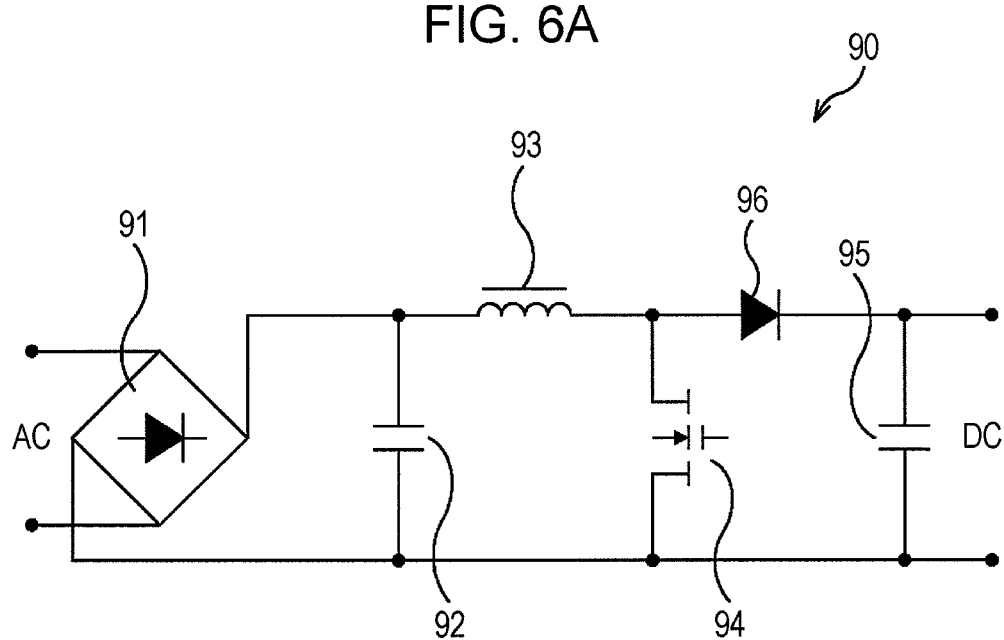
FIGS. 6A and 6B are diagrams illustrating a power supply device.
Figure 6B:
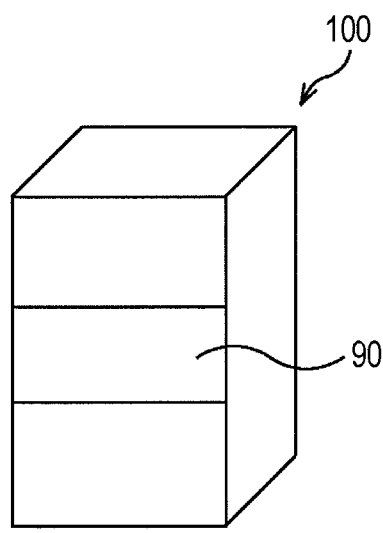

The GaN based HEMTs according to these embodiments may also be used for power supply devices, for example. FIG. 6A is a diagram illustrating a power factor correction (PFC) circuit. FIG. 6B is a diagram illustrating a server power supply (power supply device) including the PFC circuit illustrated in FIG. 6A.

As illustrated in FIG. 6A, a capacitor 92 connected to a diode bridge 91 to be connected to an alternating current power supply (AC) is disposed in the PFC circuit 90. One terminal of the capacitor 92 is connected to one terminal of a choke coil 93 and the other terminal of the choke coil 93 is connected to one terminal of a switching element 94 and an anode of a diode 96. The switching element 94 corresponds to the HEMT in the above-described embodiment, and the one terminal corresponds to the drain electrode of the HEMT. The other terminal of the switching element 94 corresponds to the source electrode of the HEMT. The cathode of the diode 96 is connected to one terminal of a capacitor 95. The other terminal of the capacitor 92, the other terminal concerned of the switching element 94, and the other terminal of the capacitor 95 are grounded. A direct current (DC) is taken from between the two terminals of the capacitor 95.

As illustrated in FIG. 6B, the PFC circuit 90 is used by being incorporated into a server power supply 100 or the like.

It is also possible to construct a power supply device which is similar to such a server power supply 100 and which is capable of higher-speed operation. A switching element similar to the switching element 94 may be used for a switching power supply or an electronic device. These semiconductor devices may also be used as components of full-bridge power supply circuits, e.g., a server power supply circuit.

In every embodiment, as for the substrate, a silicon carbide (SiC) substrate, a sapphire substrate, a silicon substrate, a GaN substrate, a GaAs substrate, or the like may be used. The substrate may be any one of electrically conductive, semi-insulating, and insulating substrates.

The structures of the gate electrode, the source electrode, and the drain electrode are not limited to those in the above-described embodiments. For example, they may be formed from single layers. These forming methods are not limited to the lift-off method. The heat treatment after formation of the source electrode and the drain electrode may be omitted insofar as the ohmic characteristics are obtained. The gate electrode may be subjected to a heat treatment.

The thicknesses, materials, and the like of the individual layers are not limited to those in the above-described embodiments.

Next, the experiment performed by the present inventors will be described. In this experiment, initially, various detergents illustrated in FIG. 7 were produced.

The term "PVA" in FIG. 7 represents polyvinyl alcohol, the term "PVP" represents polyvinyl pyrrolidone, the term "PHS" represents polyhydroxystyrene. The term "uril" represents tetramethoxymethyl glycoluril, the term "urea" represents N,N'-dimethoxymethyldimethoxyethylene urea, the term "melamine" represents hexamethoxymethyl melamine, the term "EL" represents ethyl lactate, and the term "IPA" represents isopropyl alcohol. The component of "TN-80" is an alcohol ethoxylate based surfactant (nonionic surfactant) and the component of "PC-8" is a polynuclear surfactant (nonionic surfactant). The "TN-80" and the "PC-8" are surfactants produced by ADEKA CORPORATION.

Subsequently, an i-GaN electron transit layer having a thickness of 3 μm, i-AlGaN spacer layer having a thickness of 5 nm, an n-AlGaN electron supply layer having a thickness of 30 nm and a doping concentration of $5\times10^{18}$ cm$^{-3}$, and an n-GaN cap layer having a thickness of 10 nm and a doping concentration of $5\times10^{18}$ cm$^{-3}$ are deposited on a Si substrate by the MOVPE method. Thereafter, a novolak resist was applied to the surface of the n-GaN cap layer by a spin coating method. An opening portion was formed through exposure and development. The resist and the n-GaN cap layer were removed through dry etching by using a chlorine based gas.

The detergent described in FIG. 7 was applied to the surface of the n-AlGaN electron supply layer, and heating was performed at a temperature described in FIG. 8 for 2 minutes, so as to form a surface-treated film. Then, the surface-treated film was removed by using water in Example Nos. 1 to 14 or using a mixed solution of 64.7 percent by mass of ethyl lactate and 35.3 percent by mass of isopropyl alcohol in Example No. 15. The removal time of the surface-treated film was specified to be 1 minute.

The number of particles and the oxygen concentration ratio of the surface of the n-AlGaN electron supply layer were measured with a particle counter and X-ray photoelectron spectroscopy (XPS), respectively. For purposes of comparison, the number of particles and the oxygen concentration ratio in the case where cleaning was not performed (Comparative example) were also measured. The results thereof are illustrated in FIG. 8.

As illustrated in FIG. 8, regarding Example Nos. 1 to 15, the numbers of particles were smaller than that of Comparative example. Furthermore, the oxygen concentration ratios were decreased in the most cases.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A method for manufacturing a compound semiconductor device, the method comprising:
    forming a compound semiconductor laminated structure;
    removing a part of the compound semiconductor laminated structure, so as to form a concave portion; and
    cleaning the inside of the concave portion by using a detergent,
    wherein the detergent contains a base resin compatible with residues present in the concave portion and a solvent.

2. The method for manufacturing a compound semiconductor device according to claim 1,
    wherein the base resin comprises at least one type selected from polyvinyl alcohols, polyvinyl acetals, polyvinyl acetates, polyvinyl pyrrolidones, polyacrylic acids, polyethylene oxides, phenolic hydroxyl group-containing resins, carboxylic group-containing resins, and epoxy resins.

3. The method for manufacturing a compound semiconductor device according to claim 1,
    wherein the proportion of the base resin relative to the detergent is 0.1 percent by mass to 50 percent by mass.

4. The method for manufacturing a compound semiconductor device according to claim 1,
    wherein the solvent comprises at least one type selected from the group consisting of water, alcohol based organic solvents, chain ester based organic solvents, cyclic ester based organic solvents, ketone based organic solvents, chain ether based organic solvents, cyclic ether based organic solvents, and amine based organic solvents.

5. The method for manufacturing a compound semiconductor device according to claim 1,
    wherein the detergent comprises a reducing agent.

6. The method for manufacturing a compound semiconductor device according to claim 1,
    wherein the detergent comprises a cross-linking agent.

7. The method for manufacturing a compound semiconductor device according to claim 1,
    wherein the detergent comprises a surfactant.

8. The method for manufacturing a compound semiconductor device according to claim 1,
wherein the cleaning comprises:
applying the detergent;
forming a film by vaporizing the solvent in the detergent through heating; and
removing the film.

* * * * *